US011662431B2

(12) United States Patent
Robertson, Jr. et al.

(10) Patent No.: US 11,662,431 B2
(45) Date of Patent: May 30, 2023

(54) ROTATING SENSOR ASSEMBLY

(71) Applicant: Ford Global Technologies, LLC, Dearborn, MI (US)

(72) Inventors: Michael Robertson, Jr., Garden City, MI (US); Venkatesh Krishnan, Canton, MI (US); Segundo Baldovino, Novi, MI (US); Raghuraman Surineedi, Dearborn, MI (US); Tyler D. Hamilton, Farmington, MI (US); Rashaun Phinisee, Ypsilanti, MI (US); Colm Boran, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 8 days.

(21) Appl. No.: 17/168,756

(22) Filed: Feb. 5, 2021

(65) Prior Publication Data
US 2022/0196801 A1    Jun. 23, 2022

Related U.S. Application Data

(60) Provisional application No. 63/127,353, filed on Dec. 18, 2020.

(51) Int. Cl.
*H05K 7/20* (2006.01)
*G01S 7/481* (2006.01)
*G01S 17/931* (2020.01)

(52) U.S. Cl.
CPC .......... *G01S 7/4813* (2013.01); *G01S 17/931* (2020.01); *H05K 7/20409* (2013.01)

(58) Field of Classification Search
CPC .. H05K 7/20409; G01S 17/931; G01S 7/4813
See application file for complete search history.

(56) References Cited

U.S. PATENT DOCUMENTS 5,460,425 A * 10/1995 Stephens .................... B60J 1/20
                                                   296/154
9,970,643 B2 * 5/2018 Adema ................ G03B 21/204
(Continued)

FOREIGN PATENT DOCUMENTS

DE    102017221505 A1 *  6/2019
DE    102019102933 A1 *  8/2019  ............. B60R 11/04
(Continued)

OTHER PUBLICATIONS

DE-102018210057-A1 translation (Year: 2019).*
(Continued)

*Primary Examiner* — Abhishek M Rathod
*Assistant Examiner* — Keith DePew
(74) *Attorney, Agent, or Firm* — Frank A. MacKenzie; Bejin Bieneman PLC

(57) ABSTRACT

A sensor assembly for a vehicle includes a base, a sensor body mounted to the base and rotatable relative to the base around an axis in a direction of rotation, and a cover. The sensor body includes a sensor window and a wall having heat fins elongated circumferentially relative to the axis. The cover is positioned to cover the heat fins. The cover includes an inlet open in the direction of rotation. The cover defines an airflow path from the inlet through the heat fins. The cover includes an outlet positioned to direct air across the sensor window.

18 Claims, 6 Drawing Sheets

(56) References Cited

U.S. PATENT DOCUMENTS

| | | | |
|---|---|---|---|
| 10,524,396 B2 | 12/2019 | Baldovino et al. | |
| 10,589,724 B2* | 3/2020 | Krishnan | B60S 1/0848 |
| 10,782,412 B2* | 9/2020 | Ghannam | G01S 7/4817 |
| 10,823,824 B2* | 11/2020 | Schmidt | G01S 17/08 |
| 10,845,465 B2* | 11/2020 | Krishnan | B60S 1/56 |
| 10,928,225 B1* | 2/2021 | Krishnan | G01D 11/245 |
| 10,981,518 B1* | 4/2021 | Krishnan | B60Q 1/30 |
| 11,035,934 B2* | 6/2021 | Schmidt | G01S 7/481 |
| 11,099,039 B2* | 8/2021 | Krishnan | G01L 19/14 |
| 11,156,485 B1* | 10/2021 | Krishnan | B60S 1/56 |
| 11,237,028 B1* | 2/2022 | Surineedi | G01S 7/027 |
| 11,279,325 B2* | 3/2022 | Sykula | G02B 27/0006 |
| 2004/0163330 A1* | 8/2004 | Crum | E04D 13/064 49/408 |
| 2012/0162428 A1* | 6/2012 | Wee | B60S 1/56 348/148 |
| 2017/0261273 A1* | 9/2017 | Maranville | F25B 21/02 |
| 2018/0136321 A1* | 5/2018 | Verghese | G01S 7/4865 |
| 2018/0272997 A1 | 9/2018 | Swain | |
| 2019/0154799 A1* | 5/2019 | Schmidt | G01S 17/42 |
| 2019/0154800 A1* | 5/2019 | Schmidt | G01S 7/4813 |
| 2019/0277949 A1* | 9/2019 | Krishnan | B60S 1/56 |
| 2019/0278078 A1* | 9/2019 | Krishnan | G02B 27/0006 |
| 2019/0337489 A1* | 11/2019 | Baldovino | G01N 21/15 |
| 2020/0072582 A1* | 3/2020 | Factor | G02B 26/101 |
| 2020/0088480 A1* | 3/2020 | Hu | F28F 13/12 |
| 2020/0149933 A1* | 5/2020 | Robertson, Jr | G02B 27/0006 |
| 2020/0191614 A1* | 6/2020 | Ellgas | G01D 11/24 |
| 2020/0191914 A1 | 6/2020 | Kunz et al. | |
| 2020/0191918 A1 | 6/2020 | Ellgas et al. | |
| 2020/0309913 A1* | 10/2020 | Oliveira | F28D 11/04 |
| 2020/0355807 A1* | 11/2020 | Phinisee | G01S 7/4813 |
| 2020/0386860 A1* | 12/2020 | Chung | B60R 11/04 |
| 2021/0031732 A1* | 2/2021 | Alkharabsheh | G02B 1/18 |
| 2021/0103036 A1* | 4/2021 | Robertson, Jr. | H01L 23/467 |
| 2021/0278504 A1* | 9/2021 | Phinisee | G01S 17/931 |
| 2021/0400179 A1* | 12/2021 | Brown | H04N 5/2253 |
| 2022/0034690 A1* | 2/2022 | Surineedi | G01S 17/931 |
| 2022/0089129 A1* | 3/2022 | Krishnan | B60R 11/04 |
| 2022/0097656 A1* | 3/2022 | Sykula | B05B 1/267 |
| 2022/0099802 A1* | 3/2022 | Phinisee | G01S 17/10 |
| 2022/0196807 A1* | 6/2022 | Phinisee | G01S 7/4813 |
| 2022/0236084 A1* | 7/2022 | Krishnan | G01S 17/86 |
| 2022/0236382 A1* | 7/2022 | Krishnan | G01S 7/4817 |
| 2022/0357426 A1* | 11/2022 | Krishnan | G01S 7/4813 |

FOREIGN PATENT DOCUMENTS

| | | | |
|---|---|---|---|
| DE | 102018210057 A1 * | 12/2019 | |
| DE | 102019007248 A1 | 4/2020 | |
| DE | 102020126325 A1 * | 4/2021 | F28F 3/025 |

OTHER PUBLICATIONS

DE-102019102933-A1 translation (Year: 2019).*
DE-102017221505-A1 translation (Year: 2019).*
DE-102020126325-A1 translation (Year: 2021).*

* cited by examiner

ROTATING SENSOR ASSEMBLY

CROSS-REFERENCE TO RELATED APPLICATION

This application claims priority to provisional U.S. Patent Appl. No. 63/127,353, filed on Dec. 18, 2020, which is hereby incorporated by reference in its entirety.

BACKGROUND

Vehicles, such as autonomous or semi-autonomous vehicles, typically include a variety of sensors. Some sensors detect internal states of the vehicle, for example, wheel speed, wheel orientation, and engine and transmission variables. Some sensors detect the position or orientation of the vehicle, for example, global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. Some sensors detect the external world, for example, radar sensors, scanning laser range finders, light detection and ranging (LIDAR) devices, and image processing sensors such as cameras. A LIDAR device detects distances to objects by emitting laser pulses and measuring the time of flight for the pulse to travel to the object and back. Some sensors are communications devices, for example, vehicle-to-infrastructure (V2I) or vehicle-to-vehicle (V2V) devices.

DETAILED DESCRIPTION

Figure 1:
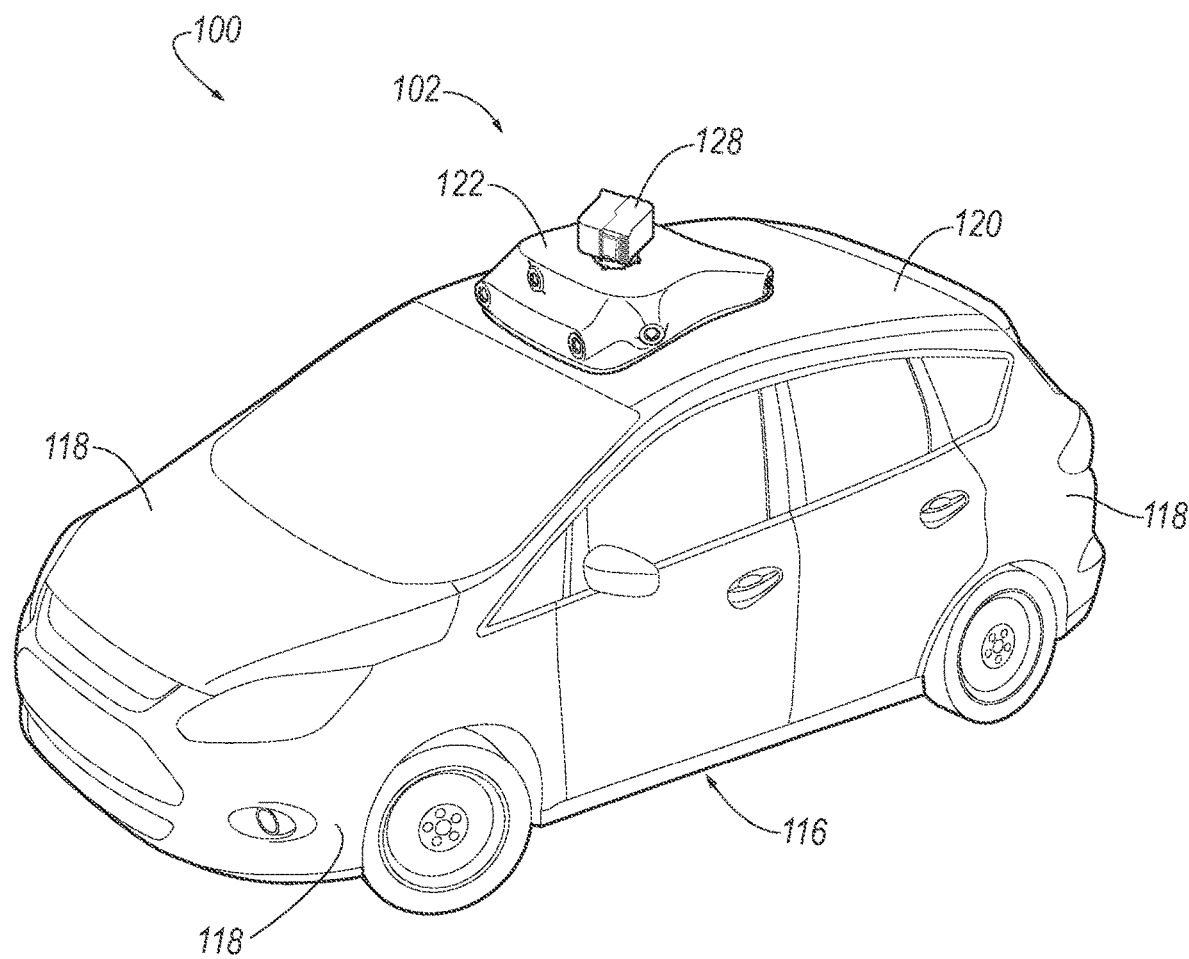
FIG. 1 is a perspective view of an example vehicle including an example sensor assembly.

A sensor assembly includes a base, a sensor body mounted to the base and rotatable relative to the base around an axis in a direction of rotation, and a cover. The sensor body includes a sensor window and a wall having heat fins elongated circumferentially relative to the axis. The cover is positioned to cover the heat fins. The cover includes an inlet open in the direction of rotation. The cover defines an airflow path from the inlet through the heat fins. The cover includes an outlet positioned to direct air across the sensor window.

The sensor assembly may further include a motor arranged to rotate the sensor body in the direction of rotation relative to the base.

The outlet may be open away from the direction of rotation.

A cross-sectional area of the outlet may be smaller than a cross-sectional area of the inlet.

The wall may be a first wall, the sensor body may include a second wall, and the sensor window may be positioned on the second wall. The heat fins may be first heat fins, the second wall may have second heat fins elongated circumferentially relative to the axis, the cover may be positioned to cover the second heat fins, and the cover may define the airflow path through the second heat fins. The airflow path may have a first leg from the inlet through the first heat fins and a second leg through the second heat fins to the outlet. A direction of airflow along the second leg of the airflow path may be parallel to the sensor window.

The cover may include a plurality of baffles partially obstructing the airflow path between the first leg and the second leg.

The heat fins may include a first heat fin, and a width of the first heat fin from the wall to a radially outer edge of the first heat fin may be more than five times as great as a gap from the first heat fin to the cover.

The sensor window may be positioned on the wall, the heat fins may be positioned closer to a leading edge of the wall than to a trailing edge of the wall with respect to the direction of rotation, and the sensor window may be positioned closer to the trailing edge of the wall than to the leading edge of the wall.

The heat fins may have a thermal conductivity equal to at least 15 watts per meter-Kelvin.

The cover may include a plurality of baffles partially obstructing the airflow path. The baffles may include an upper baffle obstructing a top half of the airflow path and a lower baffle obstructing a bottom half of the airflow path. The cover may include two drain holes, one of the drain holes may be before the lower baffle along the airflow path, and one of the drain holes may be after the lower baffle along the airflow path.

The sensor assembly may further include a ramp positioned adjacent to the sensor window opposite the outlet. The ramp may include a leading surface facing circumferentially toward the sensor window and a trailing surface facing circumferentially away from the sensor window, and the leading surface and the trailing surface may be elongated parallel to the axis. The leading surface and the trailing surface may be elongated from a bottom edge of the sensor window to a top edge of the sensor window.

The sensor assembly may further include a gutter elongated above the sensor window adjacent to the sensor window. The gutter may be elongated from a closed end nearer to the outlet to an open end farther from the outlet.

With reference to the Figures, a sensor assembly 102 for a vehicle 100 includes a base 128, a sensor body 104 mounted to the base 128 and rotatable relative to the base 128 around an axis A in a direction of rotation D, and at least one cover 106. The sensor body 104 includes at least one sensor window 108 and walls 110 having heat fins 112 elongated circumferentially relative to the axis A. The cover 106 is positioned to cover the heat fins 112. The cover 106 includes an inlet 124 open in the direction of rotation D. The cover 106 defines an airflow path from the inlet 124 through the heat fins 112. The cover 106 includes an outlet 126 positioned to direct air across the sensor window 108.

The airflow path defined by the rotation of the sensor assembly 102 provides cooling for the sensor body 104 and cleaning for the sensor windows 108. The rotation of the sensor assembly 102 forces air into the inlet 124 and along the airflow path to the outlet 126 and then across the sensor window 108. The shape of the cover 106 and the inlet 124 and outlet 126, along with the orientation of the heat fins 112, defines the airflow path that travels between the heat fins 112, providing cooling for the sensor body 104 as the sensor assembly 102 rotates. The cooling is provided as a byproduct of rotating the sensor assembly 102, obviating the need for blowers or the like to provide cooling. The outlet 126 is directed across the sensor window 108, providing an air curtain to prevent debris from contacting the sensor window 108 and blowing droplets or debris off the sensor window 108. Also, the air exiting the outlet 126 across the sensor window 108 has been heated with waste heat from the sensor body 104, so the air can be used to defrost the sensor window 108.

With reference to FIG. 1, the vehicle 100 may be any suitable type of automobile, e.g., a passenger or commercial automobile such as a sedan, a coupe, a truck, a sport utility vehicle, a crossover vehicle, a van, a minivan, a taxi, a bus, etc. The vehicle 100, for example, may be an autonomous vehicle. In other words, the vehicle 100 may be autonomously operated such that the vehicle 100 may be driven without constant attention from a driver, i.e., the vehicle 100 may be self-driving without human input. Autonomous operation can be based in part on data received from the sensor assembly 102.

The vehicle 100 includes a vehicle body 116. The vehicle body 116 includes body panels 118 partially defining an exterior of the vehicle 100. The body panels 118 may present a class-A surface, e.g., a finished surface exposed to view by a customer and free of unaesthetic blemishes and defects. The body panels 118 include, e.g., a roof 120, etc.

A housing 122 for the sensor assembly 102 and other sensors is attachable to the vehicle 100, e.g., to one of the body panels 118 of the vehicle 100, e.g., the roof 120. For example, the housing 122 may be shaped to be attachable to the roof 120, e.g., may have a shape matching a contour of the roof 120. The housing 122 may be attached to the roof 120, which can provide a sensing device 114 of the sensor assembly 102 with an unobstructed field of view of an area around the vehicle 100. The housing 122 may be formed of, e.g., plastic or metal. The sensor assembly 102 is supported by the housing 122. The sensor assembly 102 can be disposed on top of the housing 122 at a highest point of the housing 122.

Figure 2:
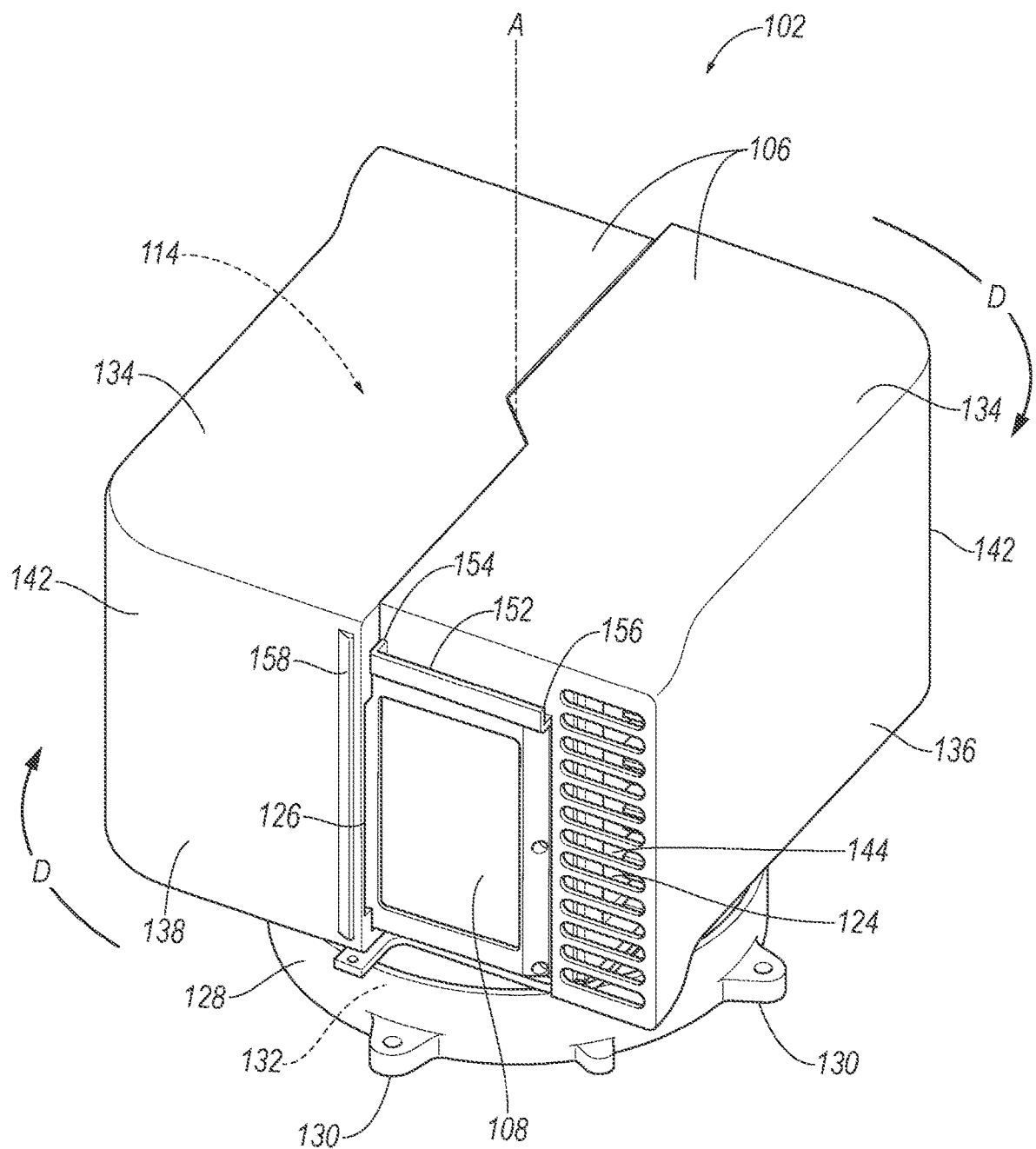
FIG. 2 is a perspective view of the sensor assembly.

With reference to FIG. 2, the sensor assembly 102 may be designed to detect features of the outside world; for example, the sensor assembly 102 may be a radar sensor, a scanning laser range finder, a light detection and ranging (LIDAR) device, or an image processing sensor such as a camera. In particular, the sensor assembly 102 may be a LIDAR device, e.g., a scanning LIDAR device. A LIDAR device detects distances to objects by emitting laser pulses at a particular wavelength and measuring the time of flight for the pulse to travel to the object and back. The operation of the sensor assembly 102 is performed by the sensing device 114 inside the sensor body 104. The sensing device 114 has fields of view through the sensor windows 108 encompassing a region from which the sensor assembly 102 receives input. As the sensor assembly 102 rotates, the fields of view encompass a horizontal 360° around the vehicle 100.

The sensor assembly 102 includes the base 128. The base 128 is attached to the housing 122 on top of the housing 122. The base 128 can be bolted to the housing 122, e.g., through bolt holes 130 in the base 128.

The sensor assembly 102 includes a motor 132. The motor 132 is arranged to drivably rotate the sensor body 104 in the direction of rotation D around the axis A. The motor 132 can be positioned, e.g., inside the base 128. The motor 132 can be, e.g., an electric motor.

Figure 3:
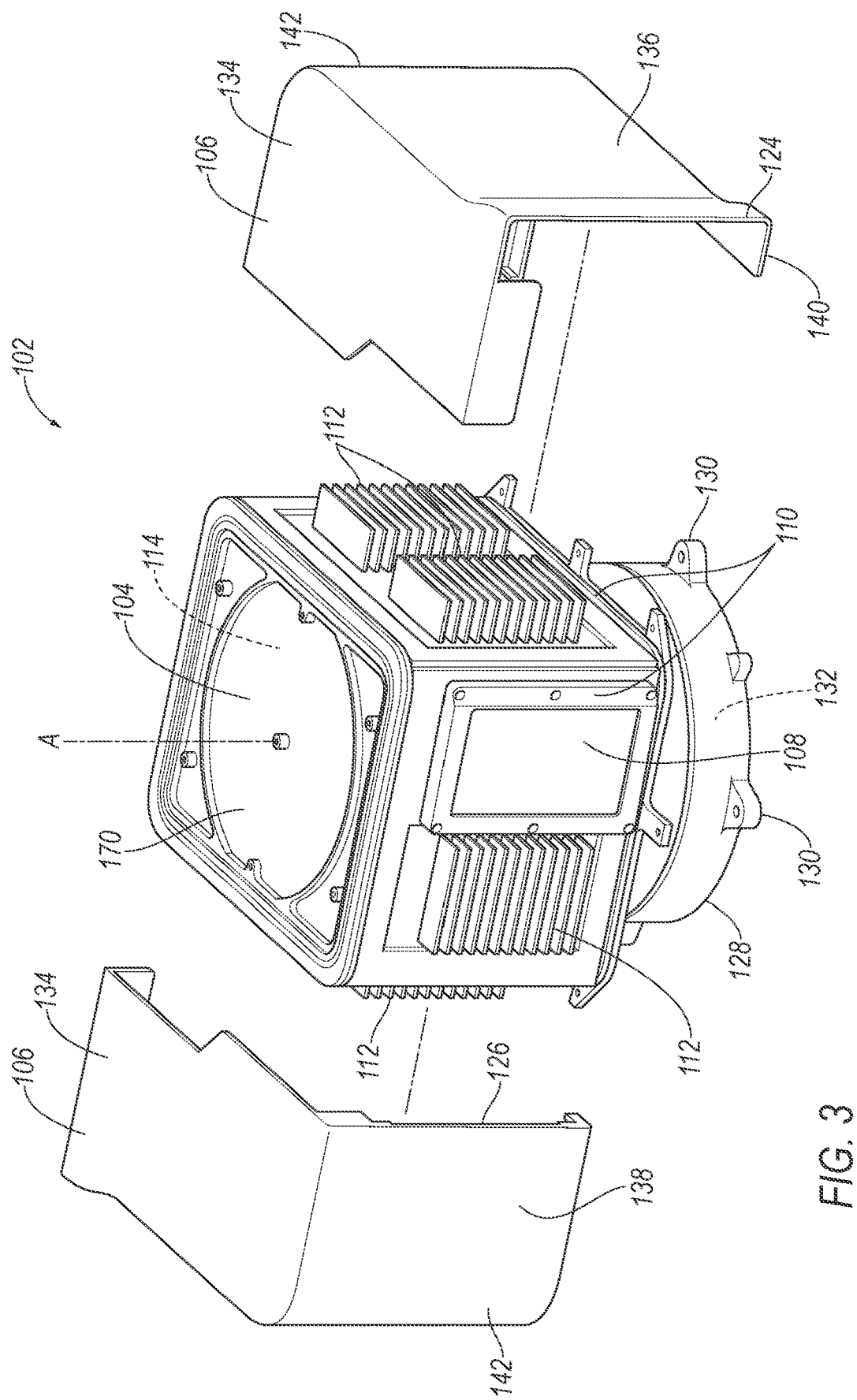
FIG. 3 is an exploded perspective view of the sensor assembly.

With reference to FIG. 3, the sensor assembly 102 includes the sensor body 104. The sensor body 104 includes walls 110, e.g., four vertical walls 110 as shown in the Figures, and a top panel 170. The walls 110 can have the same horizontal length, i.e., the walls 110 can form a square horizontal cross-section. The top panel 170 extends horizontally to each wall 110. The sensing device 114 is contained inside the sensor body 104.

The sensor assembly 102 can include at least one sensor window 108, e.g., two sensor windows 108. The sensor windows 108 are each positioned on one of the walls 110. Each sensor window 108 can be off-center on the respective wall 110. For example, the sensor window 108 can be positioned closer to a trailing edge of the respective wall 110 than a leading edge of the wall 110 with respect to the direction of rotation D. For example, each sensor window 108 can be positioned in a trailing half of the respective wall 110 with respect to the direction of rotation D. The position of the sensor windows 108 along the respective walls 110 provides room for a second leg of the airflow path that is parallel to the respective sensor windows 108, as described below. The sensor windows 108 can be flat. For example, the sensor windows 108 can have a rectangular shape. The sensor windows 108 are transparent with respect to whatever medium the sensing device 114 is capable of detecting. For example, if the sensor assembly 102 is a LIDAR device, then the sensor windows 108 are transparent with respect to visible light at the wavelength generated and detectable by the sensing device 114.

The heat fins 112 are positioned on the walls 110. The heat fins 112 are elongated in the direction of rotation D, i.e., circumferentially relative to the axis A, e.g., horizontally along the respective wall 110 for the axis A being vertical. The heat fins 112 can be positioned on all of the walls 110. The heat fins 112 on each wall 110 extend parallel to each other. The heat fins 112 can extend perpendicularly from the respective wall 110. Each heat fin 112 has a length following a direction of elongation of the heat fin 112 along the wall 110, a width perpendicular to the wall 110, and a thickness in a vertical direction. The length can be significantly greater than the width, e.g., more than twice as great. The width can be significantly greater than the thickness, e.g., more than five times as great. The heat fins 112 can be integral with the walls 110, i.e., made of a single, uniform piece of material with no seams, joints, fasteners, or adhesives holding it together.

The heat fins 112 on the same wall 110 with one of the sensor windows 108 can be positioned closer to a leading edge of the wall 110 than to a trailing edge of the wall 110 with respect to the direction of rotation D. For example, the heat fins 112 on the same wall 110 with one of the sensor windows 108 can be positioned in a leading half of the wall 110 with respect to the direction of rotation D.

The heat fins 112 are thermally conductive, i.e., have a high thermal conductivity, e.g., a thermal conductivity equal to at least 15 watts per meter-Kelvin (W/(m K)), e.g., greater than 100 W/(m K), at 25° C. For example, the heat fins 112, along with the walls 110, may be aluminum.

The sensor assembly 102 can include two covers 106. The covers 106 can be attached to the sensor body 104, e.g., rigidly attached to the sensor body 104 so that the covers 106 rotate together with the sensor body 104 as a unit. For example, the covers 106 can be bolted to the sensor body 104. The covers 106 are thus easily removable for servicing by a technician. The covers 106 may impede access to the bolt holes 130 of the base 128, but during assembly the covers 106 can be installed after bolting the base 128 to the housing 122.

The covers 106 are shaped to collectively cover the sensor body 104 including the heat fins 112. The covers 106 can collectively completely cover the top panel 170 and the walls 110 of the sensor body 104 and partially cover below the sensor body 104. The covers 106 can include two identically shaped covers 106. Each cover 106 can include a top panel 134, a larger side panel 136, a smaller side panel 138, and a bottom panel 140. The top panel 134 of each cover 106 extends horizontally across approximately half of the top panel 170 of the sensor body 104. The larger side panel 136 covers one of the walls 110 lacking a sensor window 108. The smaller side panel 138 covers the fins on one of the walls 110 including a sensor window 108, and the smaller side panel 138 exposes the respective sensor window 108. The bottom panel 140 extends from the side panels 136, 138 radially inward relative to the axis A to an edge radially inside the walls 110 of the sensor body 104. The larger and smaller side panels 136, 138 can meet at a rounded corner 142.

Returning to FIG. 2, the sensor assembly 102 includes at least one inlet 124, e.g., two inlets 124. Each inlet 124 is an opening that permits air to enter from outside to inside the covers 106. Each inlet 124 can extend from one of the larger side panels 136 to the respective sensor window 108, and from a top to a bottom of the respective sensor window 108. Each inlet 124 is open in the direction of rotation D, i.e., when the covers 106 rotate in the direction of rotation D, the inlet 124 is a leading surface and pushes through the air, instead of being on a trailing surface behind a surface pushing through the air. The rotation of the covers 106 thus pushes air into the inlets 124.

The inlets 124 can include respective inlet grills 144. Each inlet grill 144 can have openings to permit air to flow through while the openings are small enough to block some debris from entering the inlet 124. Each inlet grill 144 can completely cover the respective inlet 124. Alternatively, as shown in FIG. 3, the inlets 124 can lack the inlet grills 144.

Figure 4:
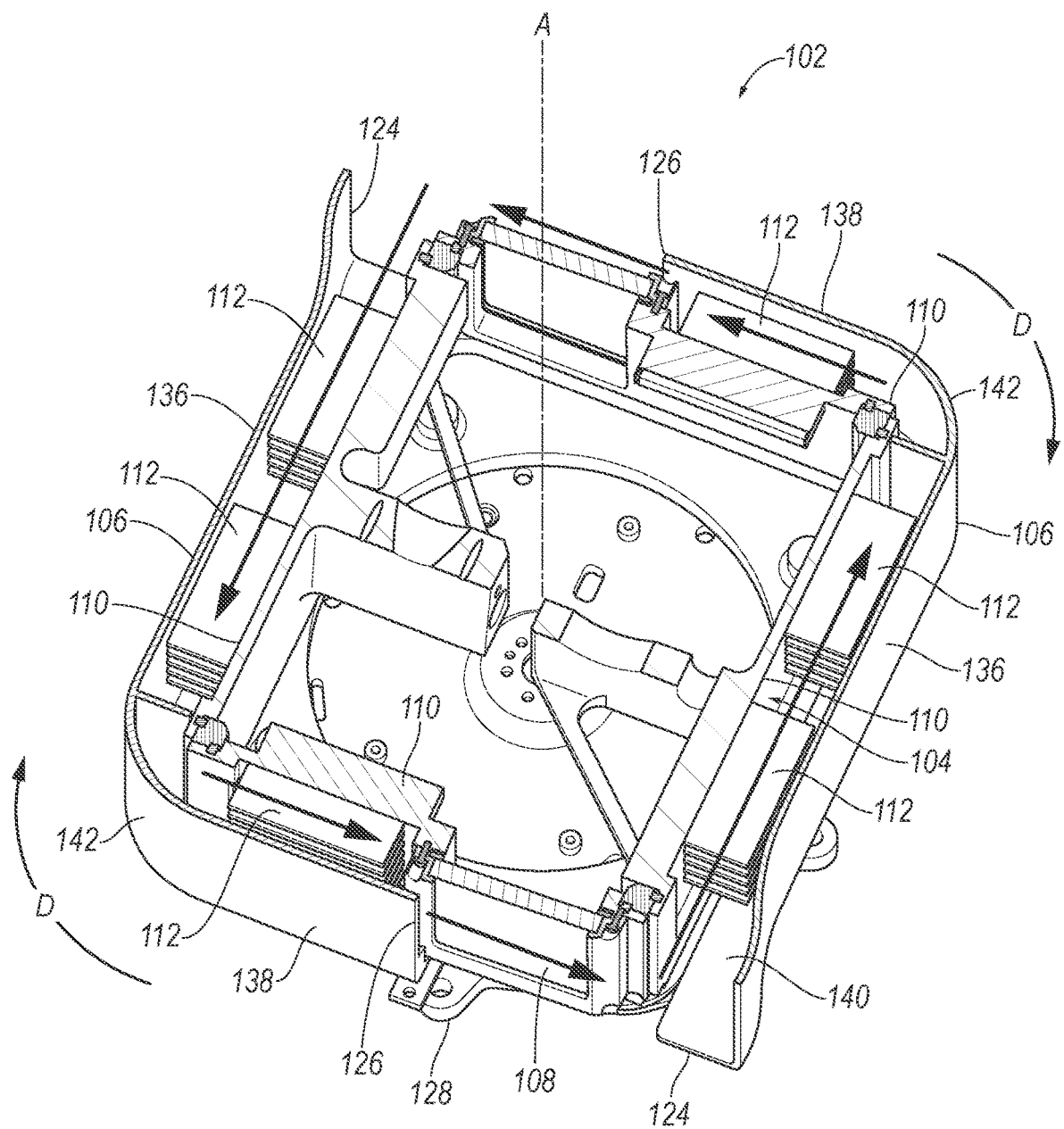
FIG. 4 is a top perspective cutaway view of the sensor assembly exposing an interior of covers of the sensor assembly for illustration.

With reference to FIG. 4, the covers 106 define airflow paths from the inlets 124 through the heat fins 112 to the outlets 126. Each airflow path is bounded by the walls 110 in a radially inward direction relative to the axis A, by the respective larger and smaller side panels 136, 138 in a radially outward direction relative to the axis A, by the respective top panel 134 of the cover 106 in an upward direction, and by the respective bottom panel 140 in a downward direction. The top and bottom panels 134, 140 can seal the airflow path at the top and bottom of the respective walls 110. Each airflow path has a first leg between one of the walls 110 lacking a sensor window 108 and the respective larger side panel 136, then a bend at the corner 142 of the respective cover 106, and then a second leg between one of the walls 110 having a sensor window 108 and the respective smaller side panel 138.

Along the first leg and the second leg of the airflow path, the air is forced between the heat fins 112, increasing the heat transfer out of the sensor body 104 compared to stationary air. The heat fins 112 extend perpendicularly to the respective wall 110 from that wall 110 toward the respective larger or smaller side panel 136, 138. The width of the heat fins 112 from the respective wall 110 to a radially outer edge of the heat fins 112 is significantly greater than a gap from the heat fins 112 to the respective side panel 136, 138, e.g., more than five times as great. The comparatively small gap means that most of the air is forced between the heat fins 112.

Figure 5:
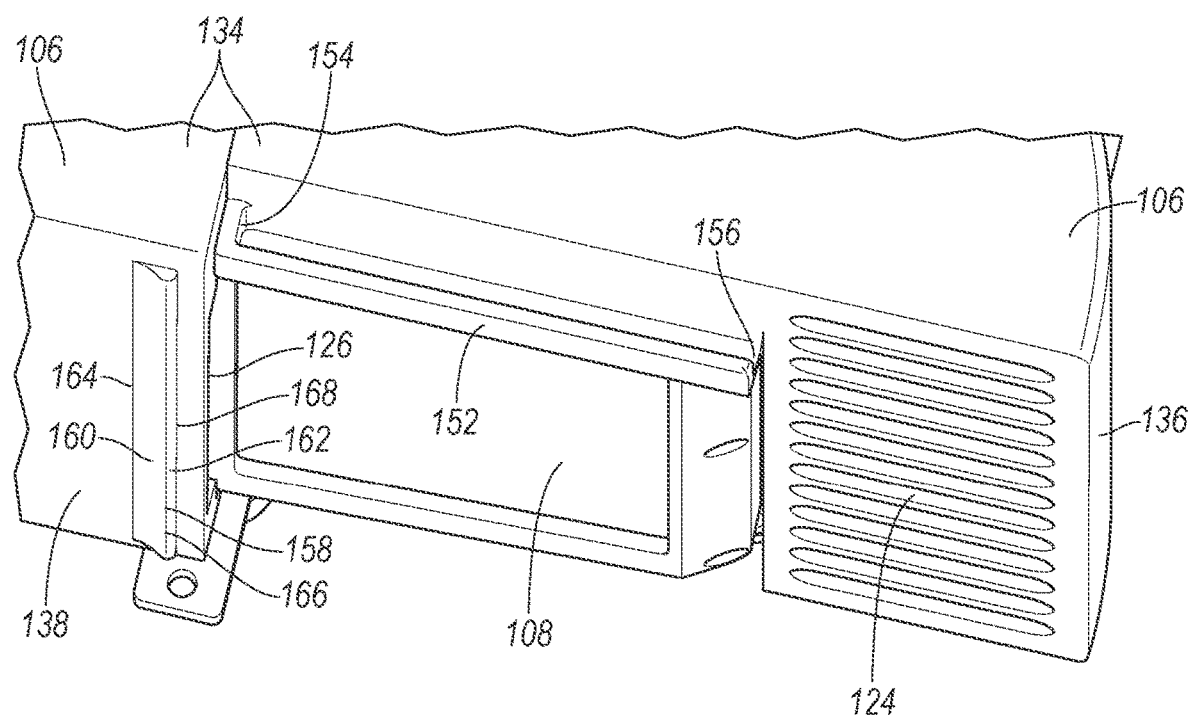
FIG. 5 is a top perspective view of a portion of the sensor assembly.

With reference to FIG. 5, the sensor assembly 102 includes at least one outlet 126, e.g., two outlets 126, specifically, one outlet 126 for each inlet 124. Each outlet 126 is an opening that permits air to exit from inside to outside the covers 106. Each outlet 126 can extend from one of the walls 110 including a sensor window 108, specifically from between the respective sensor window 108 and heat fins 112 of that wall 110, to an edge of the respective smaller side panel 138, and from a top to a bottom of the respective sensor window 108. Each outlet 126 is open opposite the direction of rotation D, i.e., when the covers 106 rotate in the direction of rotation D, the outlet 126 is a trailing surface that is shielded from pushing through the outside air, specifically by the respective smaller side panel 138. Ram air thus does not interfere with the airflow exiting through the outlets 126.

Each outlet 126 is positioned to direct air across the respective sensor window 108. Each outlet 126 directs the airflow path horizontally generally parallel to the respective sensor window 108. The second leg of the airflow path extends in a horizontal direction parallel to the sensor window 108 from the bend to the outlet 126.

Each outlet 126 has a smaller cross-sectional area than the respective inlet 124, i.e., than the inlet 124 providing airflow to that outlet 126. Specifically, heights of the respective inlets 124 and outlets 126 can be approximately equal, and a width of respective inlet 124 can be greater than a width of the respective outlet 126. Each outlet 126 can have a smaller cross-sectional area than the airflow path between the respective larger side panel 136 and the respective wall 110. Specifically, the height of the outlet 126 and a height of the airflow path along the respective larger side panel 136 can be approximately equal, and the width of the outlet 126 can be smaller than a width from respective wall 110 to the respective larger side panel 136. The comparatively smaller cross-sectional area of the outlet 126 increases the speed of the airflow through the outlet 126, providing a greater velocity of airflow across the respective sensor window 108, which can better block or remove debris from the sensor window 108.

Figure 6:
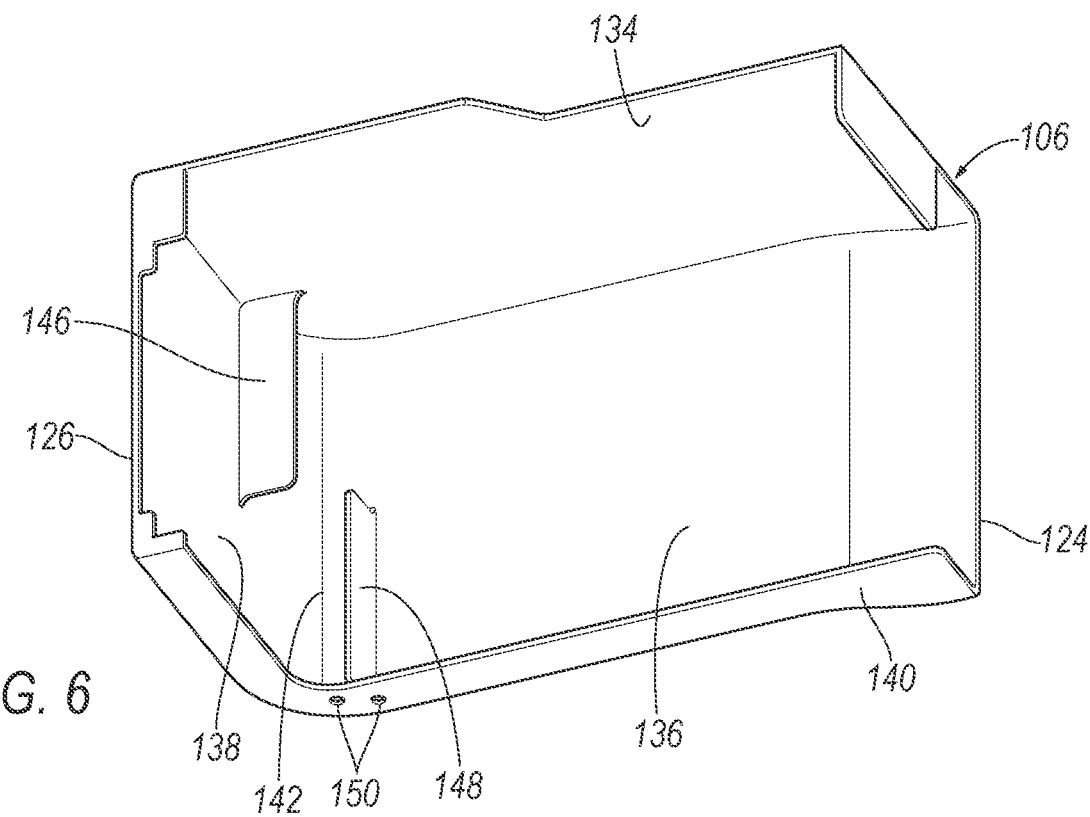
FIG. 6 is a bottom perspective view of an inside of one of the covers of the sensor assembly.
Figure 7:
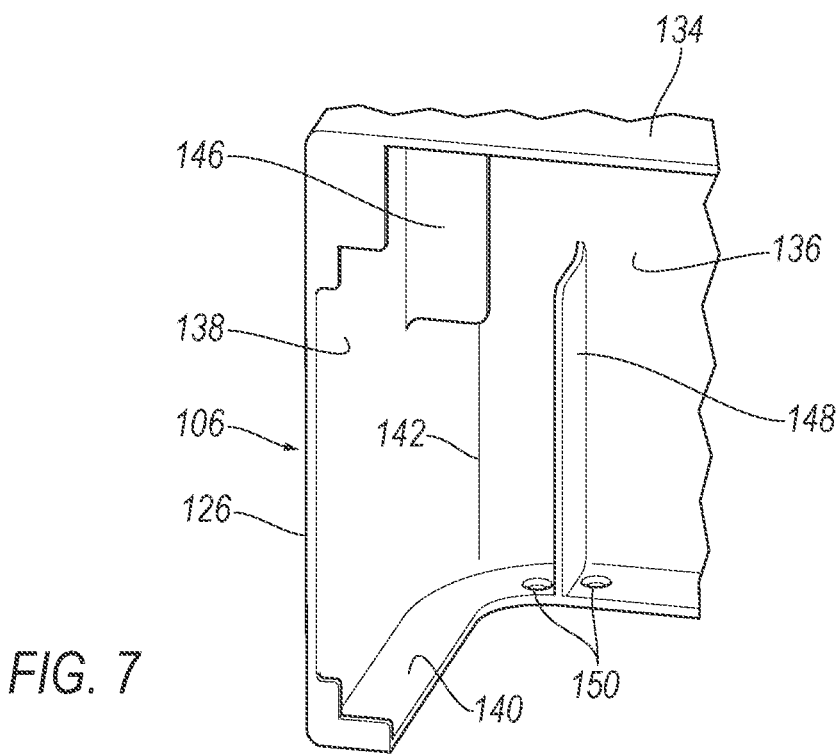
FIG. 7 is a perspective view of a portion of the inside of one of the covers of the sensor assembly.

With reference to FIGS. 6 and 7, each cover 106 can include a plurality of baffles 146, 148, e.g., two baffles 146, 148, along the airflow path. For example, as shown in FIG. 6, one baffle can be located between the first leg and the bend, and one baffle can be located between the bend and the second leg. The baffles 146, 148 extend from the respective side panels 136, 138 to or almost to the respective walls 110. The baffles 146, 148 can include an upper baffle 146 and a lower baffle 148. The upper baffle 146 can extend downward from the top panel 134 and obstruct a top half of the airflow path, and the lower baffle 148 can extend upward from the bottom panel 140 and obstruct a bottom half of the airflow path. The two baffles 146, 148 can overlap vertically, i.e., overlap in a direction parallel to the axis A, i.e., a bottom edge of the upper baffle 146 can be located below a top edge of the lower baffle 148. The baffles 146, 148 are spaced from each other. The baffles 146, 148 can dehumidify the air flowing along the airflow path. When the airflow changes directions to flow around the baffles 146, 148, water droplets in the air with greater momentum than the air molecules may strike the baffles 146, 148 and collectively condense, thus removing humidity from the air.

Each cover 106 can include at least one drain hole 150. The drain holes 150 are openings extending through the bottom panel 140 of the cover 106. For example, the cover 106 can include two drain holes 150, one on either side of the lower baffle 148, i.e., one drain hole 150 before the lower baffle 148 along the airflow path and one drain hole 150 after the lower baffle 148 along the airflow path. The drain holes 150 permit water condensed by the baffles 146, 148 to exit the covers 106.

Returning to FIG. 5, each cover 106 can include a gutter 152 elongated above the respective sensor window 108. Each gutter 152 is elongated horizontally parallel to the respective sensor window 108 from one lateral edge of the respective sensor window 108 to the other lateral edge of that sensor window 108. The gutters 152 can prevent water flowing from the top panels 134 from falling through the fields of view of the sensor windows 108. Each gutter 152 extends outward relative to the respective wall 110 past the respective sensor window 108. Each gutter 152 can extend from a closed end 154 nearer to the outlet 126 to an open end 156 farther from the outlet 126. The closed end 154 can be radially inside the open end 156. Centripetal force thus pushes water in the gutter 152 away from the closed end 154 toward the open end 156. The gutters 152 can be integral to the respective covers 106.

Each cover 106 can include a ramp 158 elongated vertically adjacent to the respective sensor window 108. Each ramp 158 includes a leading surface 160 and a trailing surface 162. The leading surface 160 extends from a leading edge 164 at the respective smaller side panel 138 to a trailing edge 166 at the trailing surface 162. The trailing surface 162 extends from the trailing edge 166 at the leading surface 160 to a rear edge 168 at the side panel 136, 138 adjacent to the respective outlet 126. Each ramp 158 is elongated vertically, i.e., parallel to the axis A, from a bottom edge of the respective sensor window 108 to a top edge of the sensor window 108. The ramps 158 can reduce water flowing from the smaller side panels 138 across the fields of view of the sensor windows 108.

Each ramp 158 has a constant cross-section taken orthogonal to the direction of elongation from the bottom edge of the respective sensor window 108 to the top edge of the sensor window 108. A path length of the leading surface 160 in the constant cross-section from the leading edge 164 to the trailing edge 166 is longer than a path length of the trailing surface 162 in the constant cross-section from the trailing edge 166 to the rear edge 168. A distance in the constant cross-section from the leading edge 164 to the trailing edge 166 is longer than a distance in the constant cross-section from the trailing edge 166 to the rear edge 168. The relative sizes of the leading surface 160 and trailing surface 162 help the ramp 158 have a ramp-like shape that sheds water.

The disclosure has been described in an illustrative manner, and it is to be understood that the terminology which has been used is intended to be in the nature of words of description rather than of limitation. The adjectives "first" and "second" are used throughout this document as identifiers and are not intended to signify importance, order, or quantity. Many modifications and variations of the present disclosure are possible in light of the above teachings, and the disclosure may be practiced otherwise than as specifically described.

What is claimed is:

1. A sensor assembly comprising:
   a base;
   a sensor body mounted to the base and rotatable relative to the base around an axis in a direction of rotation, the sensor body including a sensor window a first wall having first heat fins elongated circumferentially relative to the axis, and a second wall having second heat fins elongated circumferentially relative to the axis; and
   a cover positioned to cover the first heat fins and the second heat fins, the cover including an inlet on an exterior of the cover, the inlet being open in the direction of rotation and positioned to receive ambient air, the cover defining an airflow path from the inlet through the first heat fins and the second heat fins, the cover including an outlet positioned to direct air across the sensor window;
   wherein the sensor window is positioned on the second wall.

2. The sensor assembly of claim 1, further comprising a motor arranged to rotate the sensor body in the direction of rotation relative to the base.

3. The sensor assembly of claim 1, wherein the outlet is open away from the direction of rotation.

4. The sensor assembly of claim 1, wherein a cross-sectional area of the outlet is smaller than a cross-sectional area of the inlet.

5. The sensor assembly of claim 1, wherein the airflow path has a first leg from the inlet through the first heat fins and a second leg through the second heat fins to the outlet.

6. The sensor assembly of claim 5, wherein a direction of airflow along the second leg of the airflow path is parallel to the sensor window.

7. The sensor assembly of claim 5, wherein the cover includes a plurality of baffles partially obstructing the airflow path between the first leg and the second leg.

8. The sensor assembly of claim 1, wherein the first heat fins include a first first heat fin, and a width of the first first heat fin from the first wall to a radially outer edge of the first first heat fin is more than five times as great as a gap from the first first heat fin to the cover.

9. The sensor assembly of claim 1, wherein the second heat fins are positioned closer to a leading edge of the second wall than to a trailing edge of the second wall with respect to the direction of rotation, and the sensor window is positioned closer to the trailing edge of the second wall than to the leading edge of the second wall.

10. The sensor assembly of claim 1, wherein the first heat fins and the second heat fins have a thermal conductivity equal to at least 15 watts per meter-Kelvin.

11. The sensor assembly of claim 1, wherein the cover includes a plurality of baffles partially obstructing the airflow path between the inlet and the outlet.

12. The sensor assembly of claim 11, wherein the baffles include an upper baffle obstructing a top half of the airflow path and a lower baffle obstructing a bottom half of the airflow path.

13. The sensor assembly of claim 12, wherein the cover includes two drain holes, one of the drain holes is before the lower baffle along the airflow path, and one of the drain holes is after the lower baffle along the airflow path.

14. The sensor assembly of claim 1, further comprising a ramp positioned adjacent to the sensor window opposite the outlet.

15. The sensor assembly of claim 14, wherein the ramp includes a leading surface facing circumferentially toward the sensor window and a trailing surface facing circumferentially away from the sensor window, and the leading surface and the trailing surface are elongated parallel to the axis.

16. The sensor assembly of claim 1, further comprising a gutter elongated above the sensor window adjacent to the sensor window.

17. The sensor assembly of claim 16, wherein the gutter is elongated from a closed end nearer to the outlet to an open end farther from the outlet.

18. The sensor assembly of claim 1, wherein the inlet is positioned on an exterior of a side panel of the cover radially outward from the sensor body.

* * * * *